(12) United States Patent
Haukness (10) Patent No.: US 9,153,321 B2
(45) Date of Patent: Oct. 6, 2015

(54) RESISTANCE CHANGE MEMORY CELL CIRCUITS AND METHODS

(71) Applicant: Rambus Inc., Sunnyvale, CA (US)

(72) Inventor: Brent Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/483,359

(22) Filed: Sep. 11, 2014

(65) Prior Publication Data

US 2014/0376304 A1     Dec. 25, 2014

Related U.S. Application Data

(63) Continuation of application No. 13/882,130, filed as application No. PCT/US2011/057909 on Oct. 26, 2011, now Pat. No. 8,861,259.

(60) Provisional application No. 61/407,974, filed on Oct. 29, 2010.

(51) Int. Cl.
*G11C 13/00* (2006.01)
*G11C 8/08* (2006.01)

(52) U.S. Cl.
CPC .......... *G11C 13/0069* (2013.01); *G11C 13/004* (2013.01); *G11C 13/0007* (2013.01); *G11C 13/0028* (2013.01); *G11C 13/0097* (2013.01);
(Continued)

(58) Field of Classification Search
CPC ........... G11C 13/0097; G11C 13/0007; G11C 13/004; G11C 13/0028; G11C 13/0069; G11C 2013/0045; G11C 2013/0071; G11C 2013/0078; G11C 2213/79; G11C 7/12; G11C 8/08

USPC .............. 365/148, 46, 100, 158, 163, 189.11, 365/230.06
See application file for complete search history.

(56) References Cited

U.S. PATENT DOCUMENTS

| 6,169,456 B1 | 1/2001 | Pauls |
| 6,912,150 B2 | 6/2005 | Portman et al. |

(Continued)

FOREIGN PATENT DOCUMENTS

| JP | 2002-197853 | 7/2002 |
| KR | 10-0629619 | 10/2006 |

OTHER PUBLICATIONS

International Preliminary Report on Patentability (Chapter I) dated May 10, 2013 in International Application No. PCT/US2011/057909. 7 pages.

(Continued)

*Primary Examiner* — Tan T. Nguyen
(74) *Attorney, Agent, or Firm* — The Neudeck Law Firm, LLC (57) ABSTRACT

The gate of the access transistor of a 1 transistor 1 resistor (1T1R) type RRAM cell is biased relative to the source of the access transistor using a current mirror. Under the influence of a voltage applied across the 1T1R cell (e.g., via the bit line), the RRAM memory element switches from a higher resistance to a lower resistance. As the RRAM memory element switches from the higher resistance to the lower resistance, the current through the RRAM cell switches from being substantially determined by the higher resistance of the RRAM device (while the access transistor is operating in the linear region) to being substantially determined by the saturation region operating point of the access transistor.

20 Claims, 10 Drawing Sheets

(52) U.S. Cl.
CPC .......... *G11C 8/08* (2013.01); *G11C 2013/0045* (2013.01); *G11C 2013/0071* (2013.01); *G11C 2013/0078* (2013.01); *G11C 2213/79* (2013.01)

(56) References Cited

U.S. PATENT DOCUMENTS

| | | | |
|---|---|---|---|
| 7,092,277 B2 | 8/2006 | Bedeschi et al. | |
| 7,190,607 B2 | 3/2007 | Cho et al. | |
| 8,144,499 B2 | 3/2012 | Kitagawa et al. | |
| 8,345,466 B2 * | 1/2013 | Maejima et al. | 365/148 |
| 8,559,239 B2 | 10/2013 | Ma et al. | |
| 2008/0080229 A1 * | 4/2008 | Choi et al. | 365/148 |
| 2008/0298122 A1 | 12/2008 | Bedeschi et al. | |
| 2009/0213666 A1 | 8/2009 | Pan | |
| 2011/0128773 A1 * | 6/2011 | Azuma et al. | 365/148 |

OTHER PUBLICATIONS

International Search Report and Written Opinion dated May 8, 2012 in International Application No. PCT/US11/057909. 10 pages.
PCT Response to Invitation to Correct Defects dated Nov. 14, 2011 in International Application No. PCT/US2011/057909. 2 pages.

* cited by examiner

FIGURE 10

RESISTANCE CHANGE MEMORY CELL CIRCUITS AND METHODS

TECHNICAL FIELD

The present disclosure relates to techniques and circuits for setting a state of a resistively switched memory device. More specifically, but not exclusively, the present disclosure relates to controlling the current through a resistively switched memory device as it is switched from a high resistance state to a lower resistance state.

BACKGROUND

Several types of non-volatile memory have been developed that rely on resistive memory elements that change resistance under certain conditions. This general category of memory may be referred to as resistive change memory (a.k.a., resistive random access memory—RRAM). An RRAM memory element represents stored information as a high resistance state and one or more distinct low resistance states. A dielectric, which is normally insulating, can be made to conduct through the formation of a conducting filament or path. This filament is formed as a result of the application of a sufficiently high voltage (i.e., electric field).

Depending on the type of RRAM memory element, the conduction path formation can arise from different mechanisms. These mechanisms include defect modification, metal migration, ion migration, etc. Forming the filament is generally referred to as "setting" the RRAM memory element. Breaking the filament, usually by applying an appropriately high voltage of an opposite polarity, results in the RRAM memory element resuming a high resistance. This process is generally referred to as "resetting" the RRAM memory element. The RRAM memory element may be "set" and "reset" many times by appropriately applied voltages.

DETAILED DESCRIPTION

The process of "setting" an RRAM memory element involves applying a sufficiently high voltage (i.e., electric field) across the RRAM memory element. This electric field causes a dramatic reduction in the resistance of the RRAM memory element. This reduction in the resistance of the RRAM memory element remains until the device is "reset" by the application of another sufficiently high voltage—usually of opposite polarity. In some implementations, RRAM memory elements may be paired with an access transistor in an RRAM cell. The access transistor selectively allows current to be passed through, and voltage applied to, the RRAM memory element so that its state may be determined and/or changed. These cells may be arranged in an array so that a particular RRAM cell in the array may be set, reset, or read. Typically, a column of the array is accessed (or controlled) via a conductive path (or wire) that is referred to as a bit line. A row of the array is accessed (or controlled) via a conductive path (or wire) that is referred to a word line.

In an embodiment, during the process of "setting" a 1-transistor 1-resistor (1T1R) type RRAM cell, the access transistor is biased to act as a current limiter. The gate of the access transistor, which is typically controlled by a word line, is biased relative to the source of the access transistor using a current mirror. This current mirror may comprise a diode connected transistor as a master transistor of the current mirror and the access transistor of an RRAM cell as the slave transistor of the current mirror. The access transistor, as the slave transistor of the current mirror, limits the current through the RRAM device to approximately the reference current through the master transistor of the current mirror. Under the influence of a voltage applied across the 1T1R cell (e.g., via the bit line), the RRAM memory element switches from a higher resistance to a lower resistance. As the RRAM memory element switches from the higher resistance to the lower resistance, the current through the RRAM cell switches from being substantially determined by the higher resistance of the RRAM device (while the access transistor is operating in the linear region) to being substantially determined by the saturation region operating point of the access transistor.

In other words, in an embodiment, to "set" an RRAM cell, a programming voltage is applied across the RRAM memory element and an access transistor. At the same time, a gate-to-source bias voltage is applied to the access transistor. This gate-to-source bias voltage may be generated from a reference supplied to a circuit that includes the access transistor as the slave transistor of a current mirror. Since the access transistor is in a relatively low impedance conductive state in response to being biased, the programming voltage is initially almost entirely across the RRAM memory element. Thus, the current through the cell is substantially determined by the resistance of the RRAM memory element. The current through the cell is substantially determined by the resistance of the RRAM memory element because the drain-to-source resistance of the biased access transistor is much less than the resistance of the unset RRAM memory element.

The voltage across the RRAM memory element causes the RRAM memory element, after some period of time, to decrease in resistance. This resulting decrease in resistance causes an increase in current through both the RRAM memory element and the access transistor. At some point, the decreasing resistance of the RRAM memory element and the increasing current through the access transistor result in a drain-to-source voltage of the access transistor that places the access transistor in the saturation region of operation.

In the saturation region of operation, the current through the access transistor, and thus the RRAM memory element, is substantially determined by the gate-to-source voltage of the access transistor. Thus, the current through the RRAM memory element is limited by the current mirror circuit that includes the access transistor. The current is limited to approximately a predetermined amount. Limiting the current through the RRAM memory element also reduces the voltage across the RRAM memory element. In an embodiment, the limited current through the RRAM memory element results in a voltage across the RRAM memory element that is low enough to substantially stop further reductions in the resistance of the RRAM memory element.

Figure 1:
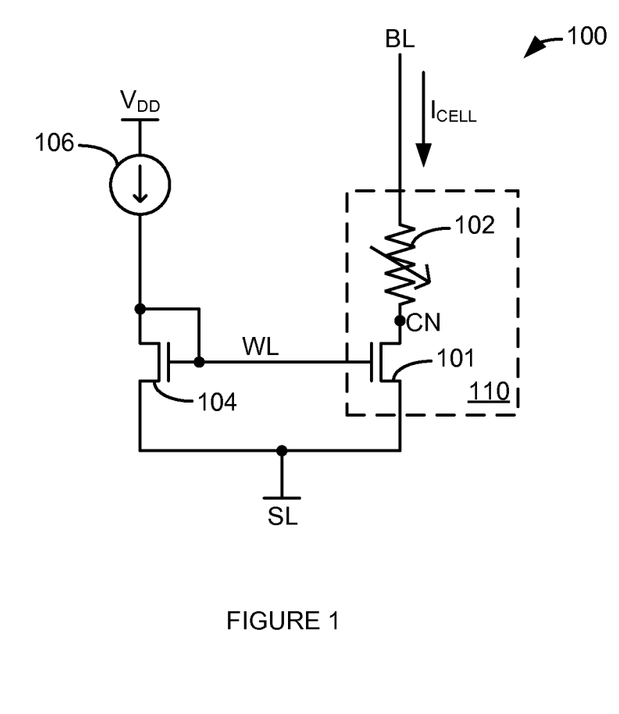
FIG. 1 is a schematic diagram illustrating an RRAM circuit.

FIG. 1 is a schematic diagram illustrating an RRAM circuit. In FIG. 1, RRAM circuit 100 comprises RRAM cell 110, diode connected transistor 104, and current reference 106. RRAM cell 110 comprises access transistor 101 and RRAM memory element 102. The sources of transistor 104 and access transistor 101 are connected to a common node (node SL). The drain of access transistor 101 is connected to a first terminal of RRAM memory element 102 (node CN). A second terminal of RRAM memory element 102 is connected to a bit line (node BL).

One type of RRAM memory element comprises a solid electrolyte such as Germanium-Selenide-Silver (GeSeAg). To "set" this type of resistive change memory element, an electric field is applied across the device. This electric field (i.e., voltage) causes metal ions from an electrode on one side of the device to migrate and form at least one filament across the device. This filament may be referred to in some literature as a channel. The filament reduces the cell resistance by providing a more conductive path across the device than existed prior to the device being set. To "reset" the device, an electric field with opposite polarity is applied. This pulls the metal ions back toward the electrode. As a result, the filament is broken and the resistance of the device is increased.

The gates of access transistor 101 and transistor 104 are connected to the drain of transistor 104. This node may be a word line (node WL). The drain of transistor 104 is also connected to receive the current flowing through current reference 106. Thus, transistor 104 and access transistor 101 form a current mirror. A current mirror is a circuit designed to copy a current through one active device, acting as a master (e.g., transistor 104), by controlling a second active device, acting as a slave (e.g., access transistor 101), thus keeping the current through the second device constant regardless of loading. The current mirroring operation may be dependent upon the second device operating in the appropriate region of operation, for example, the saturation region of a field-effect transistor (FET). It should be understood that current mirrors may be constructed or configured from other types of devices, such as bipolar junction transistors, etc.

Before being set, RRAM memory element 102 typically has a large resistance. This resistance may be on the order of $10^6$-$10^8$ ohms. To set RRAM memory element (i.e., to reduce its resistance to a value on the order of $10^3$-$10^5$ ohms), a set voltage is applied to the bit line, BL. This set voltage may be referred to as $V_{SET}$. For the purposes of the following discussion, the node SL will be used as the reference voltage (i.e., signal ground). Thus, $V_{SET}$ is referenced to the node SL. The voltage across RRAM memory element 102 is determined by the drain-to-source voltage of access transistor 101. In other words, $\Delta V_{102} = V_{BL} - V_{DS,101}$. Therefore, the current through RRAM memory element 102 (and also the drain current of access transistor 101) is: $I_{CELL} = \Delta V_{102}/R_{102}$.

To illustrate the set operation, assume that WL and BL are initially at 0V (relative to SL). Thus, node CN is also at 0V. The word line is then enabled by turning on current reference 106. This brings WL slightly above the threshold voltage of transistor 104 ($V_{TN}$). The bit line (BL) is then transitioned from 0V to $V_{SET}$. Because $R_{102}$ is initially very large relative to the drain-to-source resistance of access transistor 101 when access transistor 101 is operating in the linear region, this increases the voltage across RRAM element 102 to approximately $V_{SET}$. This approximately $V_{SET}$ voltage across RRAM element 102 causes the resistance of RRAM memory element 102 (i.e., $R_{102}$) to drop by several orders of magnitude as RRAM memory element transitions to the set state. As $R_{102}$ drops, the current through RRAM memory element 102, $I_{CELL}$, (and thus the drain current of access transistor 101) increases. At some point as $I_{CELL}$ increases, access transistor 101 enters the saturation region of operation. When access transistor 101 is in the saturation region of operation, $I_{CELL}$ is limited to approximately the current through current reference 106 ($I_{106}$).

With $I_{CELL}$ limited, the voltage across RRAM memory element 102 approaches $I_{106}*R_{102}$ (i.e., $\Delta V_{102} \approx I_{106}*R_{102}$). Since $V_{SET}$ is typically fixed during this operation, the drain-to-source voltage of access transistor 101, $V_{DS,101}$, increases if $R_{102}$ continues to decrease. The amount $V_{DS,101}$ increases is based on the resistance of $R_{102}$ (which may continue to decrease) and $I_{CELL}$. By Kirchhoff's voltage law, increases in $V_{DS,101}$ correspond to an equivalent reduction in $\Delta V_{102}$. Reductions in $\Delta V_{102}$ slow or stop the decrease in $R_{102}$ until equilibrium is reached. Thus, the set operation is self-limiting and is controlled by $I_{106}$. In an embodiment, the equilibrium current through RRAM memory element 102 may be controlled to be a predetermined multiple (e.g., 1:1, 2.5:1, 1:3, etc.) of current reference 106 by designing the width-to-length ratios of access transistor 101 and transistor 104 to be appropriate multiples of each other. For operations other than, for example, the set operation described above, the WL may be asserted to a high logical level voltage to turn the access transistor 101 to a fully on state such that $I_{CELL}$ is not limited as in the set state described above. Such operations include for example, read operations or write operations that reset the cell, in the event that set and reset operations are performed as separate operations. In another embodiment, the wordline current limiting effect (for example as in the $I_{CELL}$ generation approach described above) may be used during a read operation to limit the maximum read current for a cell. This may provide for benefits such as reducing read noise, preventing read disturb, or allowing more cells to be read simultaneously.

Because the limiting of the set current is effectively done inside RRAM cell 110, the slowing and stopping of further resistance reductions in RRAM memory element 102 may be very fast. This slowing and stopping may be very fast because it is independent of bit line resistance and capacitance. This may enable the use of much larger memory arrays thereby saving die area. It may also enable in much better control (i.e., tolerances) of the final set resistance of the RRAM memory elements 102 in an array.

The preceding example was discussed in terms of the word line being biased before the bit line was biased to $V_{SET}$. However, it should be noted that in an embodiment the bit line may be biased to $V_{SET}$ before (or simultaneously with) the word line being biased to slightly above the threshold voltage of transistor 104.

In FIG. 1, access transistor 101 is shown as an n-channel field-effect transistor (NFET). It should be readily understood that in other embodiments, access transistor 101 may be a p-channel field-effect transistor (PFET). In this case, transistor 104 may also be a PFET transistor.

Figure 2:
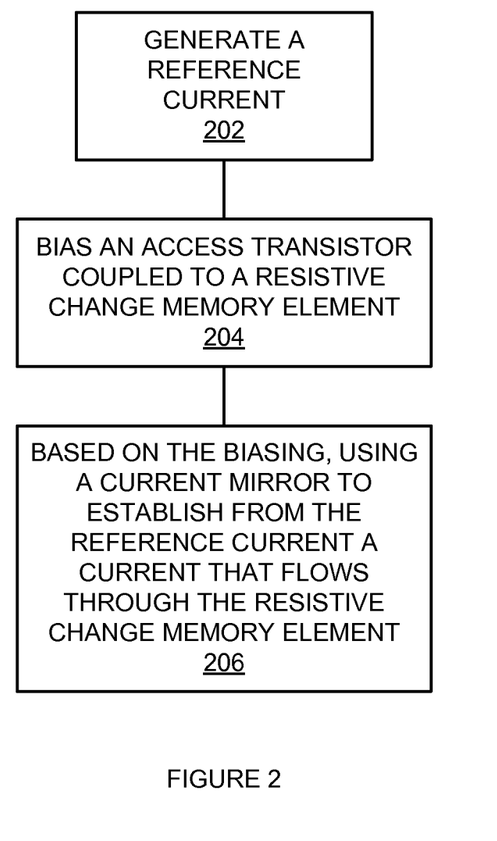
FIG. 2 is a flowchart illustrating a method of limiting RRAM current.

FIG. 2 is a flowchart illustrating a method of limiting RRAM current. The steps illustrated in FIG. 2 may be performed by (or on) one or more elements of RRAM circuit 100. A reference current is generated (202). For example, current reference 106 may be turned on (or gated through transistor 104) to provide a reference current $I_{106}$. An access transistor that is coupled to a resistive change memory element is biased (204). For example, when reference current $I_{106}$ is provided to transistor 104, transistor 104 may cause WL to be brought above the threshold voltage of transistor 104. Because the gate of access transistor 101 is also connected to WL, and the sources of transistor 104 and access transistor 101 are both connected to SL, causing WL to be brought above the threshold voltage of transistor 104 biases access transistor 101 to above the threshold voltage of transistor 104.

Based on the biasing, a current mirror is used to establish from the reference current a current that flows through the resistive change memory element (206). For example, transistor 104 and access transistor 101 form a current mirror. The current through current reference 106 (i.e., $I_{106}$), which also flows through transistor 104, establishes the biasing of access transistor 101. As described previously, when the resistance of RRAM memory element drops as it is being set, the current through RRAM memory element 102, $I_{CELL}$, (and thus the drain current of access transistor 101) increases. At some point as $I_{CELL}$ increases, access transistor 101 enters the saturation region of operation. When access transistor 101 is in the saturation region of operation, $I_{CELL}$ is limited to approximately the current through current reference 106 ($I_{106}$) by the biasing of access transistor 101. This biasing is established by the current mirror configuration formed by transistor 104 and access transistor 101.

Figure 3:
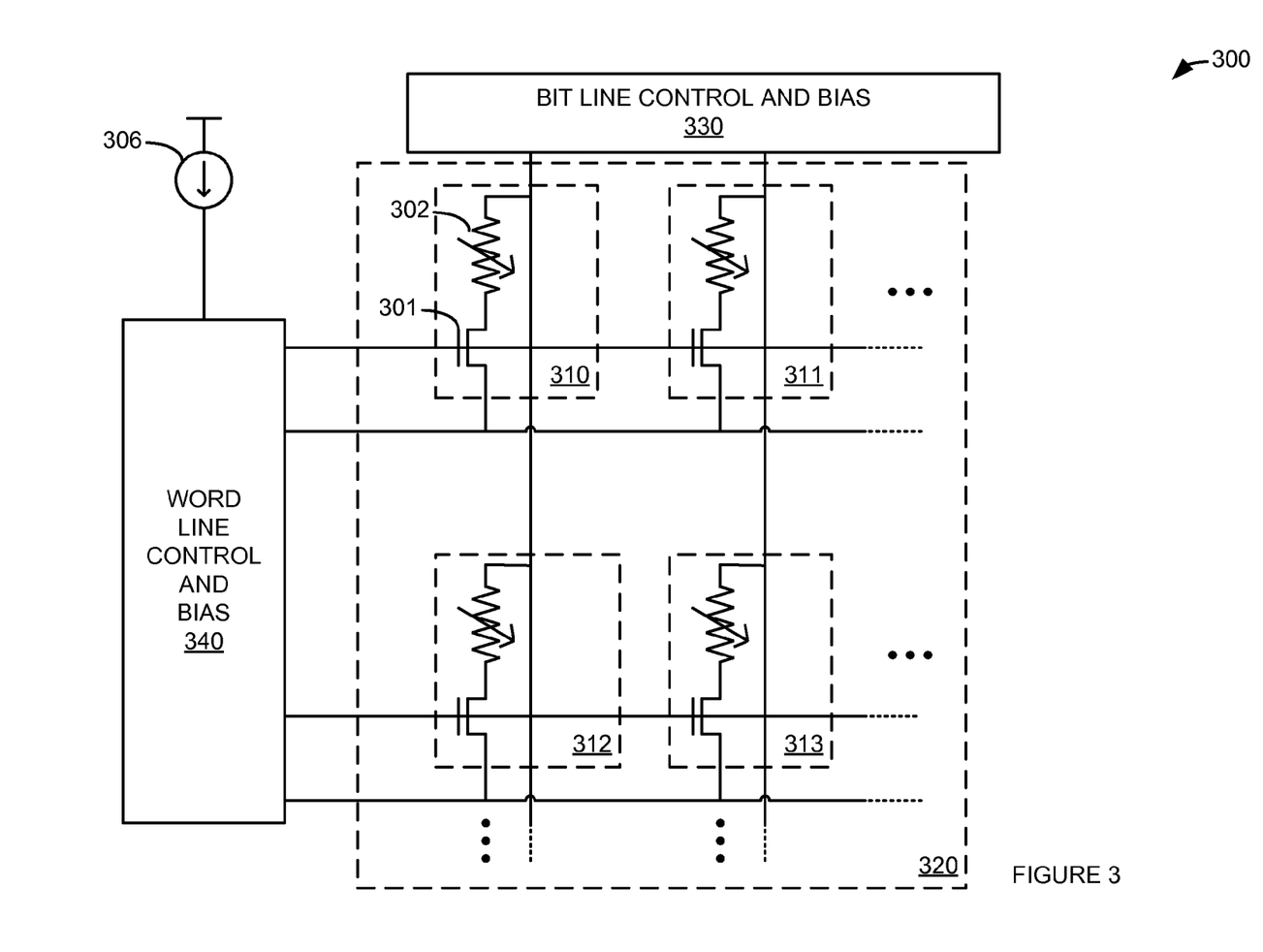
FIG. 3 is a block diagram illustrating an RRAM memory array.

FIG. 3 is a block diagram illustrating an RRAM memory array. In FIG. 3, RRAM memory array 300 comprises RRAM cell array 320, bit line control and bias 330, word line control and bias 340, and current reference 306. RRAM cell array 320 is comprised of a plurality of RRAM cells 310-313 arranged in rows and columns. In FIG. 3, RRAM cells 310 and 311 are shown in the top row. RRAM cells 312 and 313 are shown in the next row. RRAM cells 310 and 312 are shown in the leftmost column. RRAM cells 311 and 313 are shown in the next column to the right. Current reference 306 is coupled to word line control and bias 340.

Each RRAM cell 310-313 comprises a resistive change memory element 302 and an access transistor 301. The gate of each access transistor 301 in a row is connected to a word line. The source of each access transistor 301 is connected to a common source line. The common source lines of each row are also connected to word line control and bias 340. A first terminal of each resistive change memory element 302 of each RRAM cell 310-313 is connected to a bit line. A second terminal of each resistive change memory element 302 is connected to the drain of the access transistor 301 for that RRAM cell 310-313.

Each row of RRAM cell array 320 is connected to the same word line. I.e., in FIG. 3, RRAM cells 310 and 311 are connected to the same word line. RRAM cells 312 and 313 are connected to a word line, which is a different word line than is connected to RRAM cells 310-311. The word lines of RRAM cell array 320 are coupled to word line control and bias 340. Each column of RRAM cell array 320 is connected to the same bit line. I.e., in FIG. 3, RRAM cells 310 and 312 are connected to the same bit line. RRAM cells 311 and 313 are connected to a bit line, which is a different bit line than is connected to RRAM cells 310-311. The bit lines of RRAM cell array 320 are coupled to bit line control and bias 330. Thus, each RRAM cell 310-313 is uniquely addressable in RRAM array 320 by a combination of activating a word line to access all of the RRAM cells of a row (e.g., RRAM cells 310-311) and to read/write data to a particular RRAM cell of that row via an individual bit line (e.g., RRAM cell 310 via the leftmost bit line in FIG. 3).

To set a particular RRAM cell (for example, RRAM cell 310), the word line and bit line combination that are unique to that cell are initially set at 0V (as referenced to the sources of access transistor 301 in each RRAM cell 310-313) by word line control and bias 340 and bit line control and bias 330, respectively. Thus, the drain node of the access transistor 301 for that cell is also at 0V. Word line control and bias 340 brings the word line slightly above the threshold voltage of the access transistor 301. Word line control and bias may generate this voltage using a current mirror to mirror current reference 306.

The bit lines for the selected cells are then transitioned from 0V to a potential that is high enough to cause resistive change memory element 302 to transition from a high resistance state to a low resistance state (e.g., $V_{SET}$). The bit lines for non-selected cells are kept at 0V. Thus, the bit lines, by being either at a high potential or at 0V, determine which cells connected to the selected word line are to simultaneously set.

Because the resistance of resistive change memory element 302 is initially very large relative to the drain-to-source resistance of the biased access transistor 301, the voltage across resistive change memory element 302 transitions to approximately the voltage on the bit line. This voltage across resistive change memory element 302 causes the resistance of resistive change memory element 302 to drop by as much as several orders of magnitude as resistive change memory element 302 transitions to the set state. In an embodiment, the voltage across resistive change memory element 302 may be controlled to cause the resistance of resistive change memory element 302 to drop by an amount that is smaller than several orders of magnitude. As the resistance of resistive change memory element 302 drops, the current through resistive change memory element 302 increases. At some point as this current increases, access transistor 301 enters the saturation region of operation. When access transistor 301 is in the saturation region of operation, the current flowing from the bit line, through resistive change memory element 302 and access transistor 301 may be limited to approximately the current through current reference 306 by the bias output by word line control and bias 340.

With the current through the RRAM cell 310-313 limited, the voltage across resistive change memory element 302 approaches a value determined by the bias of access transistor 301. Since the voltage on the bit line is typically fixed during this operation, the drain-to-source voltage of access transistor 301 increases if the resistance of resistive change memory element 302 continues to decrease. The amount the drain-to-source voltage of access transistor 301 increases is based on the resistance of the resistive change memory element 302. By Kirchhoff's voltage law, increases in the drain-to-source voltage of access transistor 301 correspond to decreases in the voltage across resistive change memory element 302. Reducing the voltage across of resistive change memory element 302 slows or stops the decrease in the resistance of resistive change memory element 302 until equilibrium is reached. Thus, the set operation is self-limiting and is controlled by the voltage on the word line. Since the voltage on the word line may be set by word line control and bias 340 based on current reference 306, the equilibrium current through the RRAM cell 310-313 being set may be controlled to be a predetermined multiple (e.g., 1:1, 2.5:1, 1:3, etc.) of current reference 306.

The preceding example was discussed in terms of the word line being biased before the bit line was biased to a high potential. However, it should be noted that in an embodiment the bit line may be biased to before (or simultaneously with) the word line being biased.

Figure 4:
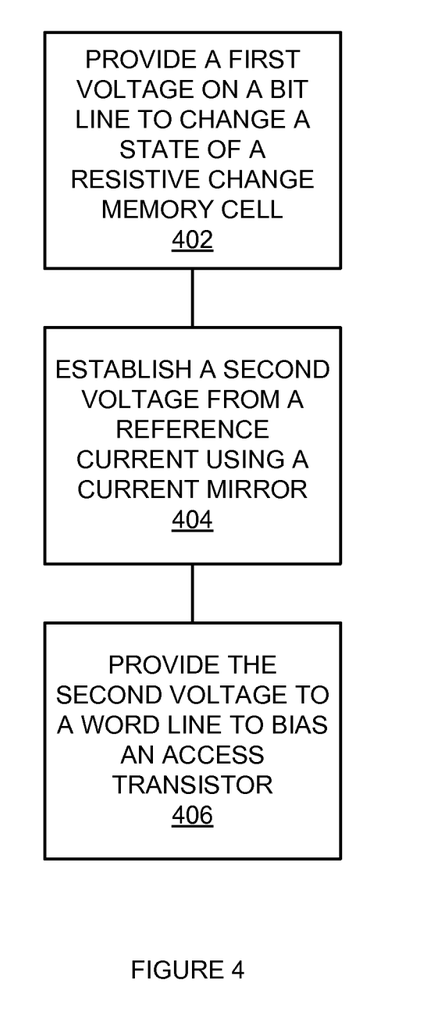
FIG. 4 is a flowchart illustrating a method of changing a state of an RRAM cell in an array.

FIG. 4 is a flowchart illustrating a method of changing a state of an RRAM cell in an array. The steps illustrated in FIG. 4 may be performed by (or on) one or more elements of RRAM circuit 100 and/or RRAM memory 300. A first voltage is provided on a bit line to change a state of a resistive change memory cell (402). For example, bit line control and bias 330 may transition a bit line to a potential that is high enough to cause resistive change memory element 302 to transition from a high resistance state to a low resistance state.

A second voltage is established from a reference current using a current mirror (404). For example, word line control and bias 340 may generate a word line bias voltage using a current mirror configuration that receives current reference 306. The second voltage is provided to a word line to bias an access transistor (406). For example, word line control and bias 340 may provide the word line bias voltage between a word line and a common source line. This word line bias voltage may bias one or more access transistors 301 of a row in RRAM array 320 such that an equilibrium current through an RRAM cell 310-313 being set by the first voltage may be controlled to be a predetermined multiple (e.g., 1:1, 2.5:1, 1:3, etc.) of current reference 306.

Figure 5:
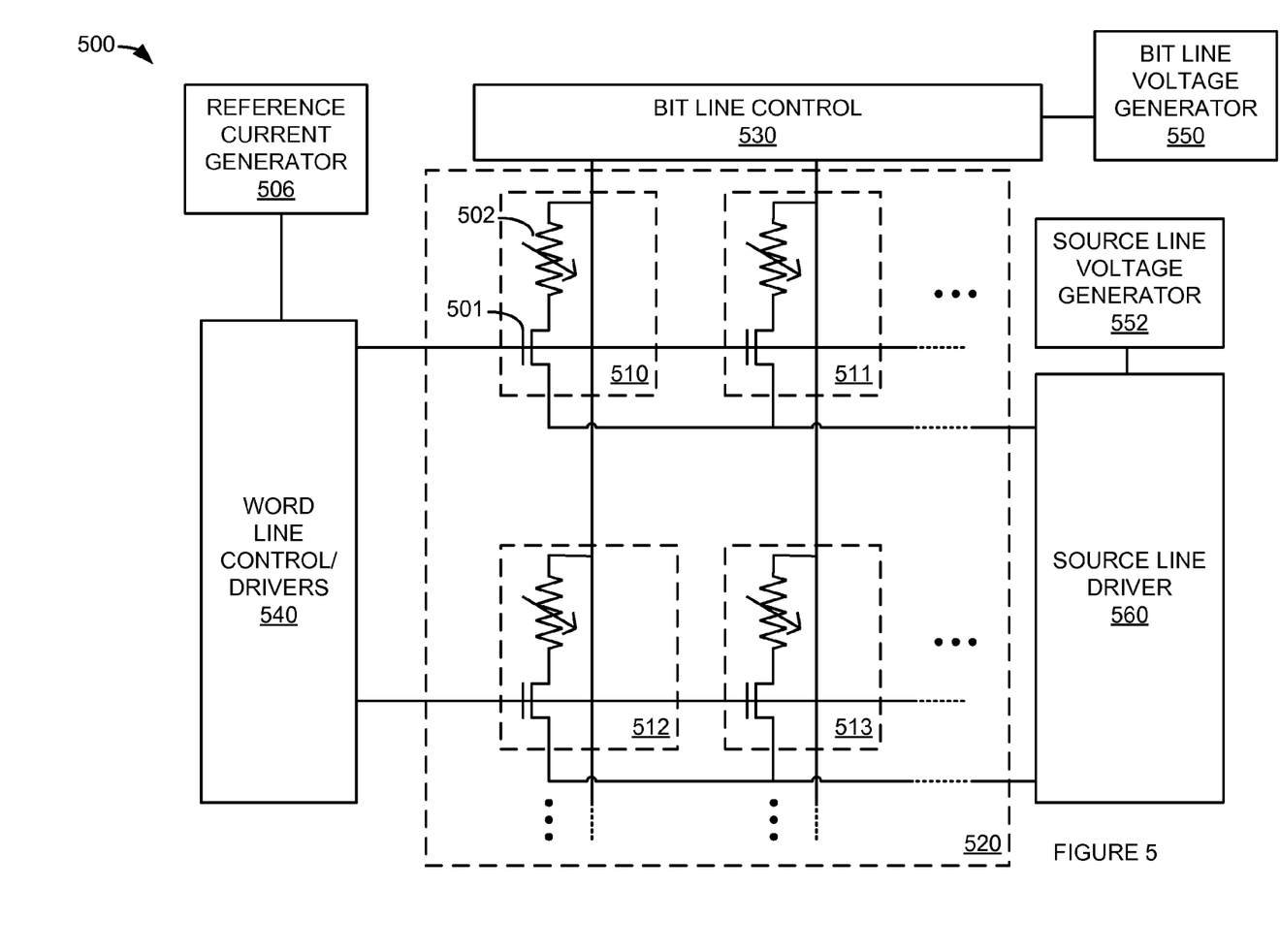
FIG. 5 is a block diagram illustrating an RRAM memory array.

FIG. 5 is a block diagram illustrating an RRAM memory array. In FIG. 5, RRAM memory array 500 comprises reference current generator 506, RRAM cell array 520, bit line control 530, word line control/drivers 540, bit line voltage generator 550, source line driver 560, and source line voltage generator 552. Reference current generator 506 is coupled to word line control/drivers 540. Bit line voltage generator 550 is coupled to bit line control 530. Source line voltage generator 552 is coupled to source line driver 552.

Similar to RRAM memory 300, each RRAM cell 510-513 comprises a resistive change memory element 502 and an access transistor 501. The gate of each access transistor 501 in a row is connected to a word line. Each word line is coupled to word line control/drivers 540. A first terminal of each resistive change memory element 502 is connected to a bit line of RRAM cell array 520. A second terminal of each resistive change memory element 502 is connected to the drain of the access transistor 501 for that RRAM cell 510-513.

Each row of RRAM cell array 520 is connected to the same word line which is unique to that row or RRAM cell array 520. The word lines of RRAM cell array 520 are coupled to word line control/drivers 540. Each column of RRAM cell array 320 is connected to the same bit line which is unique to that column of RRAM cell array 520. The bit lines of RRAM cell array 520 are coupled to bit line control 530. Thus, each RRAM cell 310-313 is uniquely addressable by a combination of activating a word line to access all of RRAM cells of a row and to receive/send results to a particular RRAM cell of that row via an individual bit line.

The source of each access transistor 501 in RRAM cell array 520 is connected to source line driver 560. Source line driver 560, in combination with word line control/drivers 540, enable the set of some RRAM cells 510-513 in a row while other RRAM cells 510-513 in the row are reset. To illustrate, consider a case where RRAM cell 510 is being set and RRAM cell 511 is simultaneously being reset.

To perform this operation, source line driver 560 transitions from 0V to a potential that is high enough to cause resistive change memory element 502 of RRAM cell 511 to transition from a low resistance state to a high resistance state (e.g., $V_{RESET}$). This voltage $V_{RESET}$ may be generated by source line voltage generator 552 and supplied to one or more common source lines of RRAM cell array 520 via source line driver 560. The bit line for RRAM cell 511, which is being reset, is held at 0V. The bit line for RRAM cell 510, which is being set, is transitioned from 0V to a potential that is high enough to cause resistive change memory element 502 of RRAM cell 510 to transition from a high resistance state to a low resistance state. Because the source of access transistor 501 for RRAM cell 510 is at $V_{RESET}$, the bit line for RRAM cell 510 must be raised to a potential that is at least $V_{RESET}$ higher than $V_{SET}$. In other words, the bit line for RRAM cell 510 is raised to a potential voltage of $V_{SET}+V_{RESET}$. This voltage of $V_{SET}+V_{RESET}$ may be generated by bit line voltage generator 550 and supplied to at least one bit line of RRAM cell array 520 via bit line control 530.

Word line control/drivers 540 brings the word line for RRAM cells 510-511 to a potential slightly above $V_{RESET}$ plus the threshold voltage of the access transistors 501 (i.e., ≈$V_{TN}+V_{RESET}$). Word line control/drivers 540 may generate this voltage from a current generated by reference current generator 506. Word line control/drivers 540 may generate this voltage using a current mirror to mirror the current received from reference current generator 506.

With the word line at approximately $V_{TN}+V_{RESET}$, and the bit line for RRAM cell 511 being at 0V, resistive change memory element 502 is exposed to a potential of $V_{RESET}$—except that the polarity is reversed with respect to $V_{SET}$ (i.e., $-V_{RESET}$). This voltage causes resistive change memory element 502 of RRAM cell 511 to transition from a low resistance state to a high resistance state. The polarity of the voltage applied to resistive change memory element 502 of RRAM cell 511 to reset it is the opposite polarity as $V_{SET}$ because that is typically what is required to reset resistive change memory element 502 from a lower resistance state to a higher resistance state. Resistive change memory element 502 of RRAM cell 511 is exposed to a potential of $-V_{RESET}$ because access transistor 501 of RRAM cell 511 acts in a source-follower configuration.

The 0V on the bit line for RRAM cell 511 pulls the drain of access transistor 501 of RRAM cell 511 to 0V. Since the gate of access transistor 501 of RRAM cell 511 is at $V_{TN}+V_{RESET}$, which is at least an n-channel FET threshold voltage above both the source and drain of access transistor 501 of RRAM cell 511, access transistor 501 of RRAM cell 511 turns on. This allows the potential on the source of access transistor 501 of RRAM cell 511 (i.e., $V_{RESET}$) to be passed to the internal node of RRAM cell 511—thus applying $-V_{RESET}$ to resistive change memory element 502 of RRAM cell 511 to reset it. The $-V_{RESET}$ voltage across resistive change memory element 502 of RRAM cell 511 causes the resistance of resistive change memory element 502 of RRAM cell 511 to increase by several orders of magnitude as resistive change memory element 502 or RRAM cell 511 transitions to the reset state.

With the word line at approximately $V_{TN}+V_{RESET}$, and the bit line for RRAM cell 510 being at $V_{SET}+V_{RESET}$, the resistance of resistive change memory element 502 of RRAM cell 510 is initially exposed to a potential of $V_{SET}$. This voltage across resistive change memory element 502 of RRAM cell 510 causes the resistance of resistive change memory element 502 of RRAM cell 510 to drop by several orders of magnitude as resistive change memory element 502 of RRAM cell 510 transitions to the set state. As the resistance of resistive change memory element 502 of RRAM cell 510 drops, the current through resistive change memory element 502 of RRAM cell 510 increases. At some point as this current increases, access transistor 501 of RRAM cell 510 enters the saturation region of operation. When access transistor 501 of RRAM cell 510 is in the saturation region of operation, the current flowing from the bit line of RRAM cell 510, through resistive change memory element 502 and access transistor 501 of RRAM cell 510 may be limited in response to the voltage driven on the word line by word line control/drivers 540.

The voltage driven on the word line by word line control/drivers 540 may be set such that, when the access transistor 501 of RRAM cell 510 reaches saturation, only approximately the current supplied by reference current generator 506 is allowed by access transistor 501 of RRAM cell 510 to flow through resistive change memory element 502. In an embodiment, the equilibrium current through the RRAM cell 510 may be controlled to be a predetermined multiple (e.g., 1:1, 2.5:1, 1:3, etc.) of the current received from reference current generator 506. The equilibrium current through the RRAM cell 510 may be controlled to be the predetermined multiple of the current received from reference current generator 506 by designing the width-to-length ratios of access transistor 501 of RRAM cell 510 and a transistor (not shown) of word line control/drivers 540 that receives a current from reference current generator 506 to be appropriate multiples of each other.

The word lines of the non-selected rows (e.g., RRAM cells 512-513) are driven by word line control/drivers 540 to 0V. This ensures that the access transistors 501 of non-selected RRAM cells 512-513 are off. The access transistors 501 of non-selected RRAM cells 512-513 are off because the gates of these access transistors 501 are less than an n-channel threshold voltage above either the source or drain of these access transistors 501. This results in the potential across the resistive change memory elements 502 of RRAM cells 512-513 being 0V or approximately 0V—thus not changing their state.

In FIG. 5, source line driver 560 is shown on the opposite side of RRAM cell array 520 as word line control/drivers 540. However, this is merely for the purposes of illustration. Source line driver 560 may reside on the same side as, or be integrated with, word line control/drivers 540.

Figure 6:
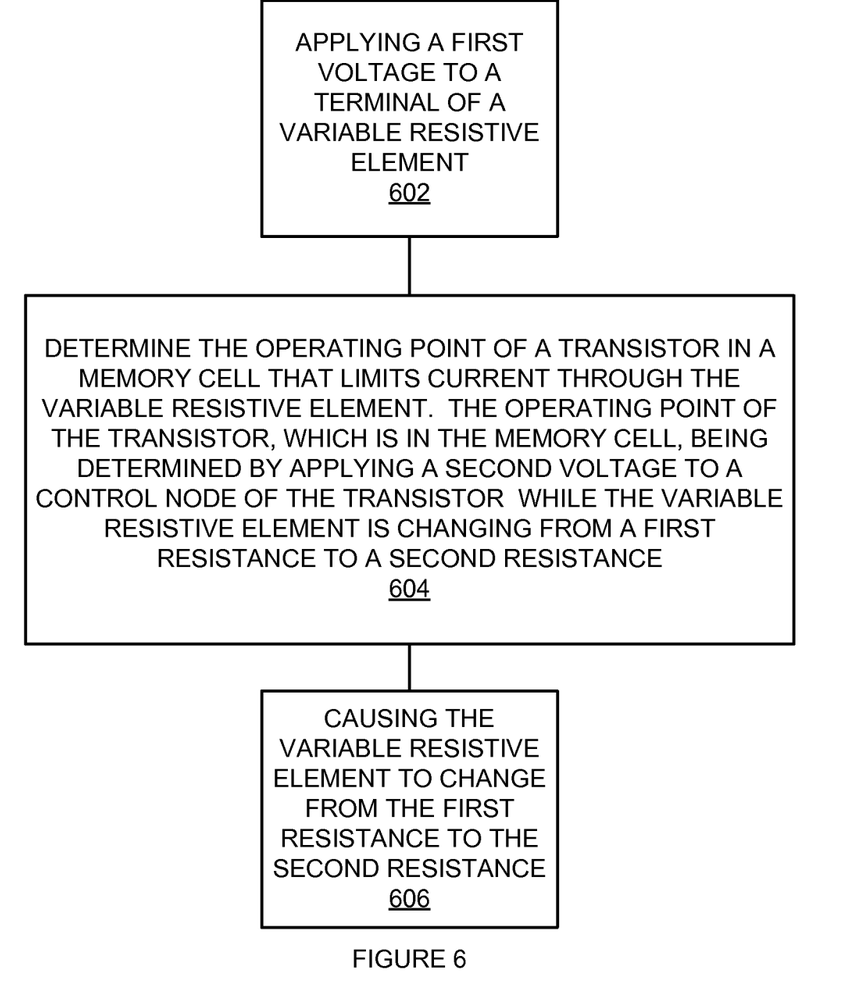
FIG. 6 is a flowchart illustrating a method of limiting current while changing a state of an RRAM device.

FIG. 6 is a flowchart illustrating a method of limiting current while changing a state of an RRAM device. The steps illustrated in FIG. 6 may be performed by (or on) one or more elements of RRAM circuit 100, RRAM memory 300, and/or RRAM memory 500. A first voltage is applied to a terminal of a variable resistive element (602). For example, a potential of $V_{SET}+V_{RESET}$ may be applied to the bit line for RRAM cell 510 thereby applying a $V_{SET}+V_{RESET}$ voltage across resistive change memory element 502 of RRAM cell 510.

An operating point of a transistor in a memory cell that limits current through the variable resistive element is determined. The operating point of the transistor is determined by applying a second voltage to a control node of the transistor while the variable resistive element is changing from a first resistance to a second resistance (604). For example, word line control/drivers 540 may determine the operating point of access transistor 501 of RRAM cell 510 by applying a bias voltage to the word line of RRAM cell 510. This bias voltage may result in access transistor 501 of RRAM cell 510 operating in the linear region of operation as resistive change memory element 502 of RRAM cell 510 changes from a higher resistance to a lower resistance. This bias voltage may result in access transistor 501 of RRAM cell 510 operating in the saturation region of operation thereby limiting the current through as resistive change memory element 502 of RRAM cell 510 as resistive change memory element 502 of RRAM cell 510 changes from a higher resistance to a lower resistance.

The variable resistive element is caused to change from the first resistance to the second resistance (606). For example, the potential of $V_{SET}+V_{RESET}$ on the bit line of RRAM cell 510, and a potential of $V_{RESET}$ on a source line of RRAM cell 510, and the second voltage on the gate of access transistor 501 of RRAM cell 510, may cause resistive change memory element 502 of RRAM cell 510 to change from a higher resistance to a lower resistance. As resistive change memory element 502 of RRAM cell 510 changes from a higher resistance to a lower resistance, the operating point of access transistor 501 of RRAM cell 510 may limit the current through resistive change memory element 502 of RRAM cell 510.

Figure 7:
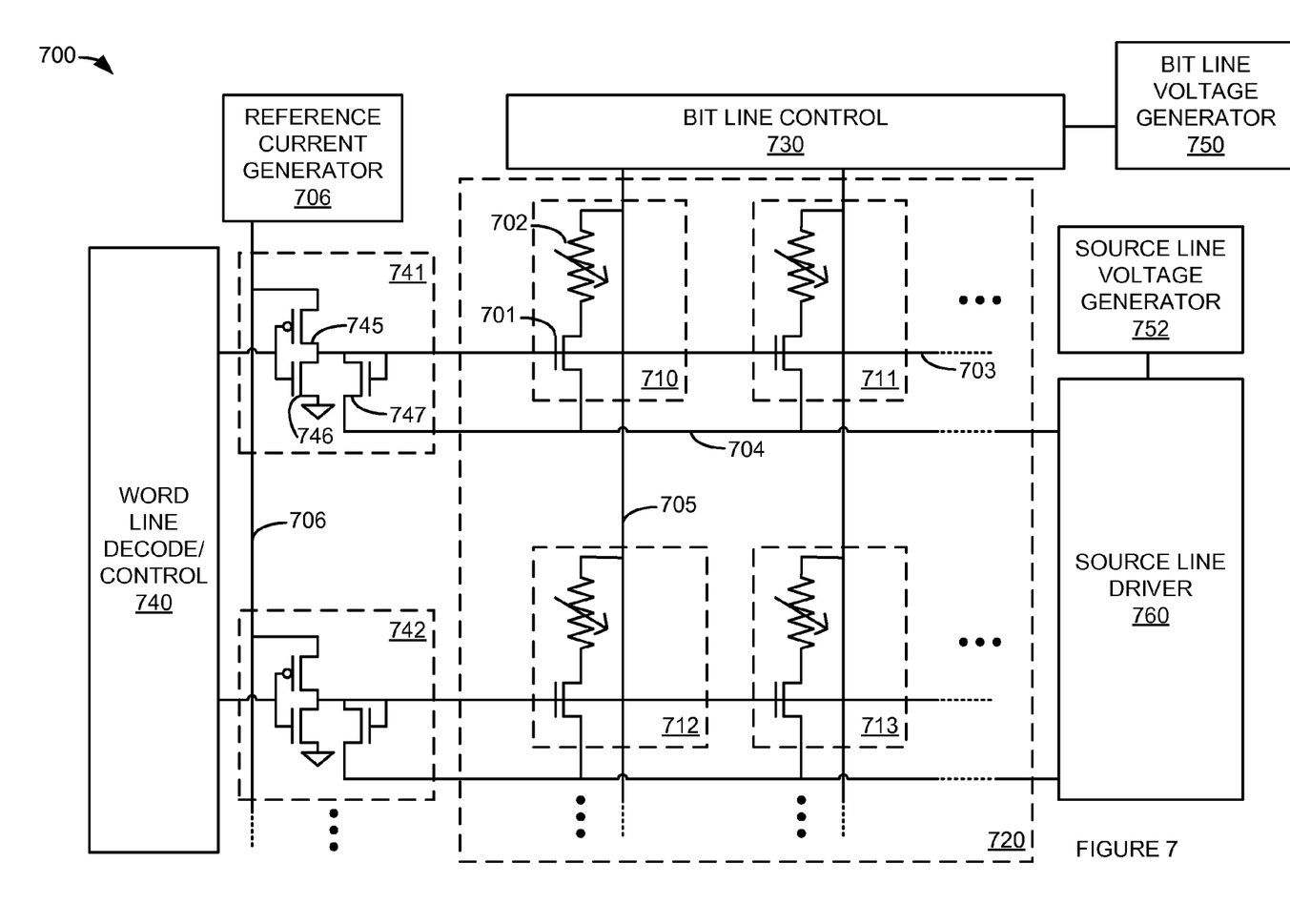
FIG. 7 is a block diagram illustrating an RRAM memory detailing a word line driver.

FIG. 7 is a block diagram illustrating an RRAM memory detailing a word line driver. In FIG. 7, RRAM memory 700 comprises reference current generator 706, RRAM cell array 720, bit line control 730, word line decode/control 740, word line drivers 741-742, bit line voltage generator 750, source line driver 760, and source line voltage generator 752. Bit line voltage generator 750 is coupled to bit line control 730. Source line voltage generator 752 is coupled to source line driver 752.

Similar to RRAM memory 300 and RRAM memory 500, each RRAM cell 710-713 comprises a resistive change memory element 702 and an access transistor 701. The gate of each access transistor 701 in a row is connected to a word line 703. Each word line 703 of a row is uniquely coupled to word line driver 741-742. A first terminal of each resistive change memory element 702 or a column is uniquely connected to a bit line 705. A second terminal of each resistive change memory element 702 is connected to the drain of the access transistor 701 for that RRAM cell 710-713. Thus, each RRAM cell 710-713 is uniquely addressable by a combination of activating a word line 703 to access all of the RRAM cells of a row and to receive and send results to a particular RRAM cell 710-713 of that row via a bit line 705.

The source of each access transistor 701 is connected to source line driver 760 via a common source line 704. Source line driver 760, in combination with word line control/drivers 740, enable the set of some RRAM cells 710-713 in a row while other RRAM cells 710-713 in the row are reset. This was described previously in the discussion of FIG. 5 and therefore will not be repeated here for the sake of brevity. Word line drivers 741-742 may provide the word line voltages (biases) and transitions described previously in association with RRAM memory 300 and RRAM memory 500.

Word line drivers 741-742 comprise p-channel field effect transistor (PFET) 745, and n-channel field effect transistors (NFETs) 746 and 747. The source of PFET 745 is connected to receive a reference current from reference current generator 706. The drain of PFET 745 is connected to word line 703. The drain of NFET 746 is connected to word line 703. The source of NFET 746 is connected to a signal reference voltage (e.g., signal ground or $V_{SS}$.) The drain and gate of NFET 747 is connected to word line 703. Because of these connections, NFET 747 may be referred to as a diode connected transistor or diode connected FET. The source of diode connected NFET 747 is connected to common source line 704. The gates of PFET 745 and NFET 746 are coupled to word line decode/control 740.

To program (i.e., set and reset RRAM cells 710-713) a row of RRAM memory 700, word line decode/control 740 outputs a logical high (or "1") to all of the word line drivers 741-742 except the selected word line driver connected to the selected row. This ensures that NFET 746 is on. This pulls each of the non-selected word lines to a low voltage potential ensuring that the access transistors 701 of each of the non-selected rows remain off during the programming process. Keeping the access transistors 701 of the non-selected rows results in the potential across the resistive change memory elements 702 of the non-selected RRAM cell rows being 0V, or approximately 0V—thus not changing the state of the resistive change memory elements 702 in those rows. The logical high output to the non-selected drivers also ensures that PFET 745 is off. Thus, the current output by reference current generator 706 is not allowed to pass through PFET 745 of the word line drivers 741-742 of the non-selected rows.

For the following discussion, assume that RRAM cells 710 and 711 represent the selected row. Word line decode/control 740 outputs a logical low (or "0") to the word line driver of the selected row. This logical low causes NFET 746 to be off and PFET 745 to be on. Since only one row is receiving a logical low from word line decode/control 740, the entire current from reference current generator 706 flows to source line driver 760 via PFET 745 of the selected row and diode connected FET 747. The current flowing through diode connected FET 747 causes diode connected FET 747 to produce a bias voltage between word line 703 and common source line 704.

This bias voltage between word line 703 and common source line 704 of the selected row is such that the current flowing through diode connected FET 747 is "mirrored" by the access transistors 701 of the RRAM cells 710-711 of the selected row. In other words, when PFET 745 is on, it allows the current produced by reference current generator 706 to flow through diode connected FET 747 of the selected row. Diode connected FET 747 is coupled to the access transistors 701 in such a way as to form a "current mirror" whereby, when access transistors 701 of the selected row are operating in the saturation region, the current flowing through access transistors 701 (and thus the current flowing through the resistive change memory elements 702) of the selected row may be limited. This limited current is determined by the current flowing through diode connected FET 747. The current limitation may be approximately the same as the current flowing though diode connected FET 747, or approximately a multiple of that current. Current limits that are a multiple of the current flowing through diode connected FET 747 may be configured by choosing appropriate ratios between the width-to-length ratios of diode connected FET 747 and access transistors 701.

In FIG. 7, source line driver 760 is shown on the opposite side of RRAM cell array 720 as word line decode/control 740. However, this is merely for the purposes of illustration. Source line driver 760 may reside on the same side as, or be integrated with, word line control/drivers 740. In addition, in an embodiment, PFET 745 may be replaced with, or wired in parallel with an NFET or some other form of pass-gate.

Also in FIG. 7, access transistors 701 are shown as NFETs. Likewise, NFET 746 and FET 747 are shown as NFETs, and PFET 745 is a PFET. It should be understood that in other embodiments, access transistors 701 may be implemented as PFETs. In these embodiments, the function of FET 747 may be implemented as a PFET. Also, as appropriate, the function of PFET 745 may be replaced with an appropriately wired and controlled NFET. The function of NFET 746 may be replaced with an appropriately wired and controlled PFET.

Figure 8:
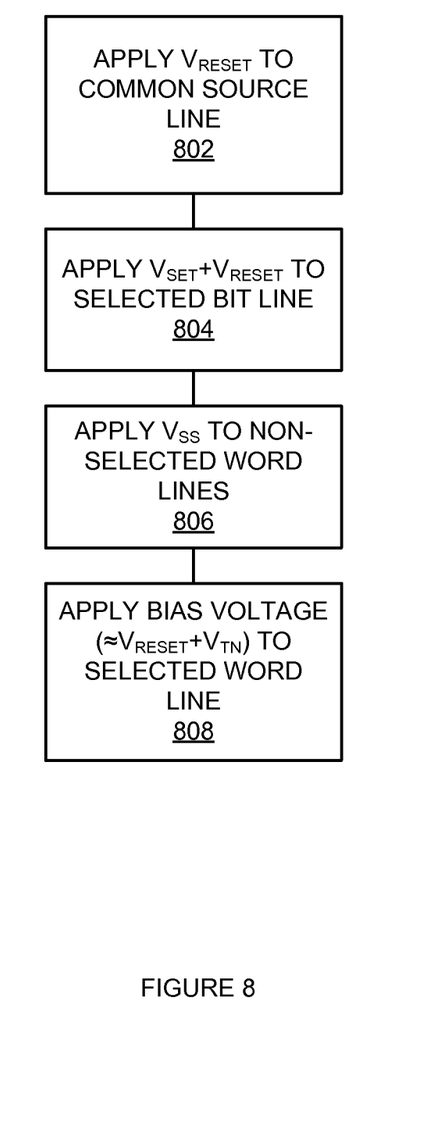
FIG. 8 is a flowchart illustrating a method of programming a plurality of RRAM cells.

FIG. 8 is a flowchart illustrating a method of programming a plurality of RRAM cells. The steps illustrated in FIG. 8 may be performed by (or on) one or more elements of RRAM circuit 100, RRAM memory 300, RRAM memory 500, and/or RRAM memory 700.

A $V_{RESET}$ voltage potential is applied to a common source line (802). For example, source line driver 760 may apply a $V_{RESET}$ voltage generated by source line voltage generator 752 to one or more common source lines 704 of RRAM cell array 720. A $V_{SET}+V_{RESET}$ voltage is applied to a selected bit line (804). For example, bit line control 730 may apply a $V_{SET}+V_{RESET}$ voltage generated by bit line voltage generator 750 to bit line 705.

A signal ground ($V_{SS}$) voltage is applied to non-selected word lines (806). For example, word line decode/control 740 may control word line driver 742 to apply a $V_{SS}$ potential to its associated word line. A bias voltage of approximately (but typically larger than) $V_{RESET}$ plus the threshold voltage of an access transistor is applied to a selected word line (808). The bias voltage applied is approximately enough greater than $V_{RESET}$ to allow a desired, but limited, current to flow. For example, a reference current flowing through diode connected FET 747 may generate a bias voltage for word line 703. This bias voltage may cause access transistors 701 to limit the current flowing through the resistive change memory elements 702 of the selected row. The reference current flowing through diode connected FET 747 may be supplied via a gating FET (such as PFET 745) which ensures that only the word line driver 741 associated with the selected row generates the bias voltage on the selected word line 703.

Figure 9:
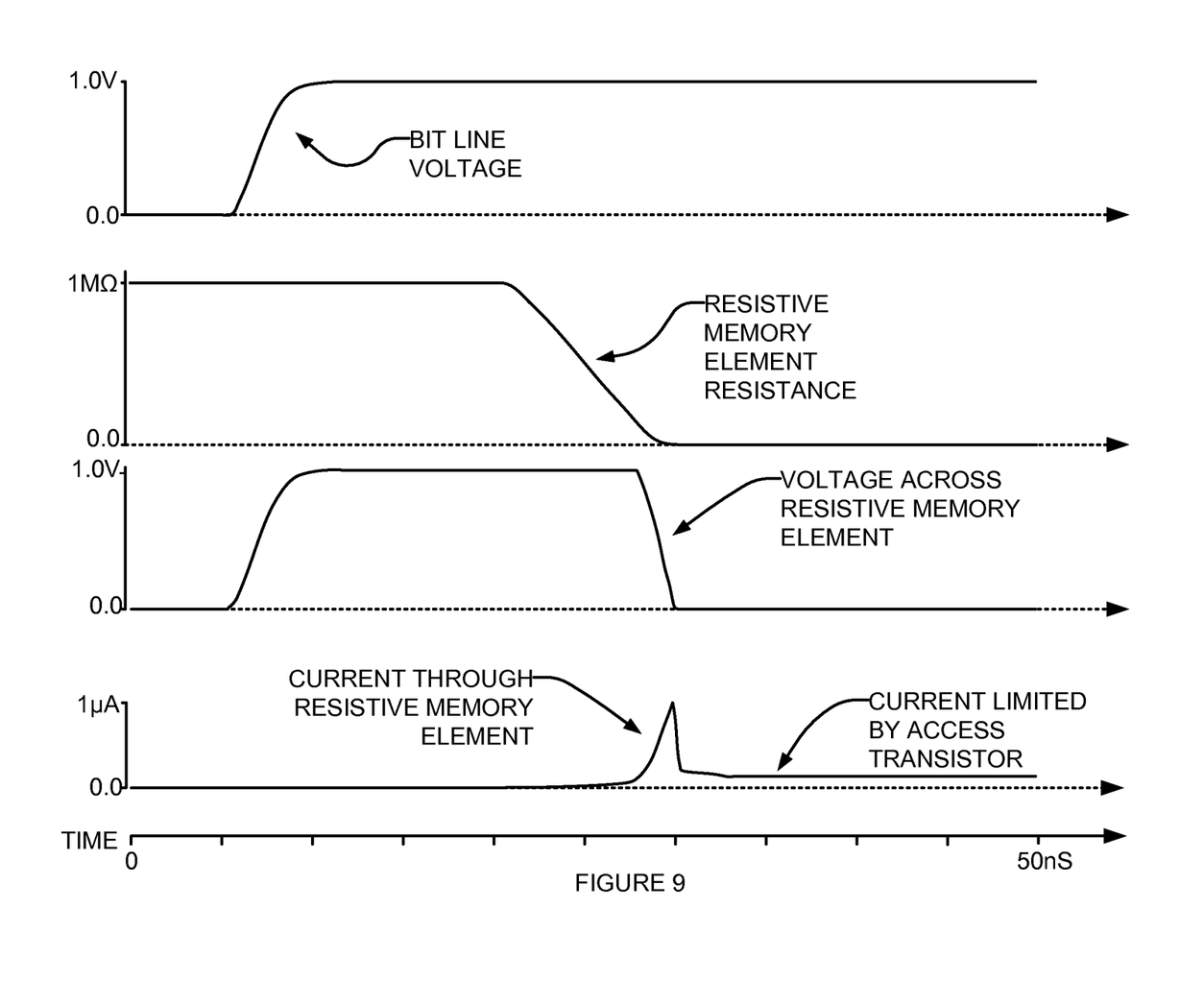
FIG. 9 is a graph of various currents and voltages associated with limiting current while changing of a state of an RRAM cell.

FIG. 9 is a graph of various currents and voltages associated with limiting current while changing of a state of an RRAM cell. In FIG. 9, the bit line voltage is transitioned from approximately 0V to approximately 1V. Concurrent with this transition, the voltage across the resistive memory element (for example, RRAM memory element 102) transitions from approximately 0V to approximately 1V. At a later time, the resistance of the resistive memory element falls from about 1 MΩ to a relatively low value (e.g., 10 kΩ). This fall in resistance is a result of the voltage across the resistive memory element. During the fall in resistance of the resistive memory element, the current though the resistive memory element increases. Then, after increasing for a period of time, the current though the resistive memory element is reduced and limited by the access transistor to approximately an equilibrium value.

The methods, systems and devices described above may be implemented in computer systems, or stored by computer systems. The methods described above may also be stored on a computer readable medium. Devices, circuits, and systems described herein may be implemented using computer-aided design tools available in the art, and embodied by computer-readable files containing software descriptions of such circuits. This includes, but is not limited to one or more elements of RRAM circuit 100, RRAM memory 300, RRAM memory 500, and/or RRAM memory 700, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
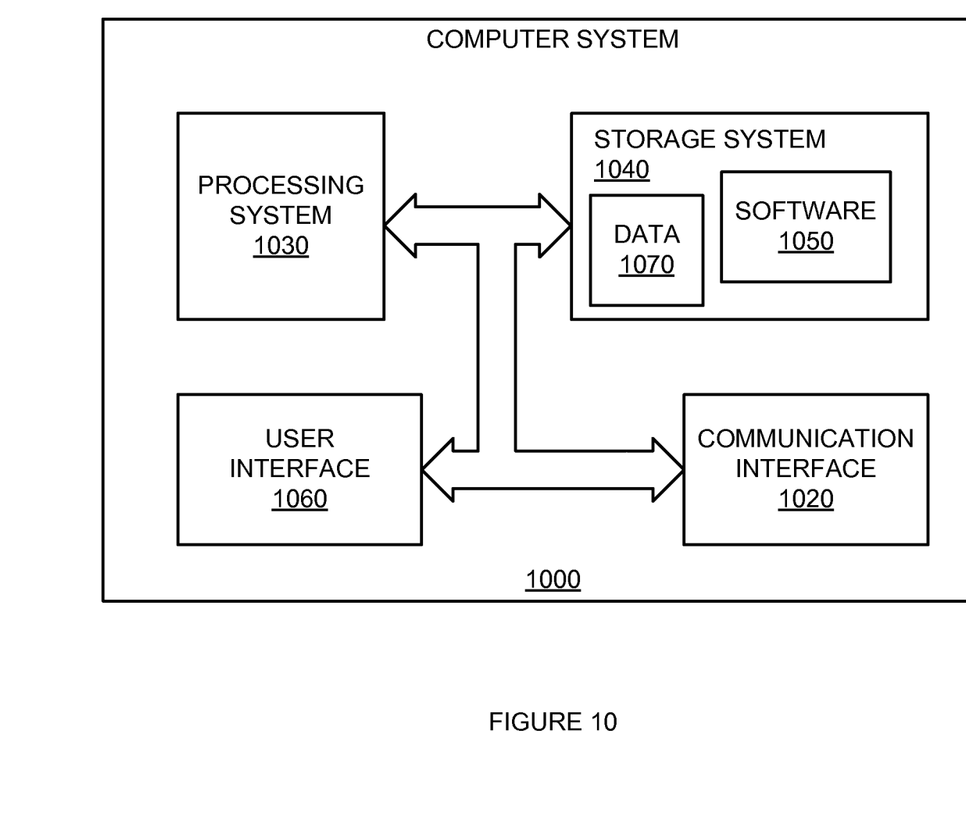
FIG. 10 is a block diagram of a computer system.

FIG. 10 illustrates a block diagram of a computer system. Computer system 1000 includes communication interface 1020, processing system 1030, storage system 1040, and user interface 1060. Processing system 1030 is operatively coupled to storage system 1040. Storage system 1040 stores software 1050 and data 1070. Storage system 1040 may include one or more of memory systems 100, 200, 300, or 400. Processing system 1030 is operatively coupled to communication interface 1020 and user interface 1060. Computer system 1000 may comprise a programmed general-purpose computer. Computer system 1000 may include a microprocessor. Computer system 1000 may comprise programmable or special purpose circuitry. Computer system 1000 may be distributed among multiple devices, processors, storage, and/or interfaces that together comprise elements 1020-1070.

Communication interface 1020 may comprise a network interface, modem, port, bus, link, transceiver, or other communication device. Communication interface 1020 may be distributed among multiple communication devices. Processing system 1030 may comprise a microprocessor, microcontroller, logic circuit, or other processing device. Processing system 1030 may be distributed among multiple processing devices. User interface 1060 may comprise a keyboard, mouse, voice recognition interface, microphone and speakers, graphical display, touch screen, or other type of user interface device. User interface 1060 may be distributed among multiple interface devices. Storage system 1040 may comprise a disk, tape, integrated circuit, RAM, ROM, EEPROM, flash memory, network storage, server, or other memory function. Storage system 1040 may include computer readable medium. Storage system 1040 may be distributed among multiple memory devices.

Processing system 1030 retrieves and executes software 1050 from storage system 1040. Processing system may retrieve and store data 1070. Processing system may also retrieve and store data via communication interface 1020. Processing system 1050 may create or modify software 1050 or data 1070 to achieve a tangible result. Processing system may control communication interface 1020 or user interface 1070 to achieve a tangible result. Processing system may retrieve and execute remotely stored software via communication interface 1020.

Software 1050 and remotely stored software may comprise an operating system, utilities, drivers, networking software, and other software typically executed by a computer system. Software 1050 may comprise an application program, applet, firmware, or other form of machine-readable processing instructions typically executed by a computer system. When executed by processing system 1030, software 1050 or remotely stored software may direct computer system 1000 to operate as described herein.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A memory device comprising:
    memory cells each having a resistance which is changeable from at least a first resistance to a second resistance;
    a first voltage generating circuit to generate a voltage to apply to a terminal of at least one of the memory cells; and
    a second voltage generating circuit to generate a bias voltage to be applied to a control node of a transistor in at least one of the plurality of memory cells, the bias voltage determining an operating point of the transistor that establishes a current to flow through the transistor, the current to flow through at least one variable resistive device of the memory cell to change the resistance of the at least one variable resistive device from the first resistance to the second resistance while being limited by the operating point of the transistor.

2. The integrated circuit device of claim 1, wherein the bias voltage controls the current that flows through the transistor.

3. The integrated circuit device of claim 1, wherein the first resistance is greater than the second resistance and the current is initially substantially determined by the voltage and the first resistance and is subsequently substantially determined by the transistor after the variable resistive device has changed from the first resistance to the second resistance.

4. The integrated circuit device of claim 1, wherein the second voltage generating circuit receives a reference current.

5. The integrated circuit device of claim 4, further comprising:
    a reference current generator that provides the reference current to the second voltage generating circuit.

6. The integrated circuit device of claim 5, wherein the second voltage generating circuit comprises a current mirror receiving the reference current.

7. The integrated circuit device of claim 5, wherein the second voltage generating circuit comprises a diode connect transistor to generate the bias voltage.

8. An integrated circuit device having a resistive change memory cell in an array having a plurality of bit lines and a plurality of word lines, comprising:
    a bit line driver to drive a first voltage onto one of the plurality of bit lines to change a state of the resistive change memory cell; and
    a word line driver to drive a second voltage on a word line of the plurality of word lines, the second voltage to determine a maximum current to flow through a resistive change memory element of the resistive change memory cell as a state of the resistive change memory element is changed by the first voltage.

9. The integrated circuit device of claim 8, wherein the second voltage determines a gate to source voltage of a field-effect transistor (FET) of the resistive change memory cell.

10. The integrated circuit device of claim 9, wherein during a change of state of the resistive change memory cell, a current flows from the bit line through the resistive change memory element and a channel of the FET while a change of a resistance of the resistive change memory element occurs.

11. The integrated circuit device of claim 10, wherein the current is limited to the maximum current flow by an operating point of the FET that is based on the gate to source voltage.

12. The integrated circuit device of claim 9, wherein the gate to source voltage is determined by a diode-connected FET receiving a reference current.

13. The integrated circuit device of claim 12, wherein the FET and the diode-connected FET have matched gate lengths.

14. The integrated circuit device of claim 8, wherein the word line driver receives a reference current.

15. A method for changing a resistance of at least one variable resistive device within a memory device from a first resistance to a second resistance, wherein the memory device comprises a plurality of memory cells which are formed at least in part by variable resistive elements, the method comprising:
    applying a first voltage to a terminal of the at least one variable resistive element;
    applying a second voltage to a control node of a transistor in at least one of the plurality of memory cells while the variable resistive element is changing from the first resistance to the second resistance, the first voltage, the resistance of the variable resistive element, and the second voltage determining an operating point of the transistor that limits a current flow through the variable resistance element, the current flow through the variable resistance element causing the at least one variable resistive device to change the resistance from the first resistance to the second resistance while being limited by the operating point of the transistor.

16. The method of claim 15, wherein the second voltage controls the current flow through the transistor.

17. The method of claim 16, wherein the first resistance is greater than the second resistance and the current is initially substantially determined by the first voltage and the first resistance and is subsequently substantially determined by the transistor operating point after the variable resistive element has changed from the first resistance to the second resistance.

18. The method of claim 15, further comprising:
receiving a reference current that is used to generate the second voltage.

19. The method of claim 18, further comprising:
generating the reference current.

20. The method of claim 18, further comprising:
generating the second voltage from the reference current using a current mirror.

* * * * *